(12) United States Patent
Cleary et al.

(10) Patent No.: US 6,888,394 B2
(45) Date of Patent: May 3, 2005

(54) VOLTAGE LEVEL SHIFTING CIRCUIT WITH IMPROVED SWITCHING SPEED

(75) Inventors: Martin L. Cleary, Bracknell (GB); Kenneth S. Hunt, Finchampstead (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/227,608

(22) Filed: Aug. 23, 2002

(65) Prior Publication Data

US 2003/0234678 A1 Dec. 25, 2003

(30) Foreign Application Priority Data

Jun. 25, 2002 (GB) .............................................. 0214663

(51) Int. Cl.[7] .................................................. H03L 5/00
(52) U.S. Cl. ............................ 327/333; 326/68; 326/81
(58) Field of Search ........................... 327/333, 51, 52, 327/65, 67, 87, 89, 81; 326/63, 68, 80, 81

(56) References Cited

U.S. PATENT DOCUMENTS

| | | | |
|---|---|---|---|
| 4,532,436 A | 7/1985 | Bismarck | 327/208 |
| 4,611,130 A * | 9/1986 | Swanson | 327/65 |
| 4,656,373 A | 4/1987 | Plus | 326/81 |
| 4,695,744 A * | 9/1987 | Giordano | 327/333 |
| 4,980,583 A | 12/1990 | Dietz | 326/68 |
| 4,996,443 A | 2/1991 | Tateno | 326/68 |
| 5,128,555 A | 7/1992 | Millman | 327/156 |
| 5,289,057 A | 2/1994 | Kinugasa | 326/68 |
| 5,410,189 A | 4/1995 | Nguyen | 327/374 |
| 5,493,245 A | 2/1996 | Kao et al. | 327/333 |
| 5,698,993 A * | 12/1997 | Chow | 326/81 |
| 5,742,183 A | 4/1998 | Kuroda | 326/81 |
| 5,933,043 A | 8/1999 | Utsunomiya et al. | 327/333 |
| 6,043,699 A * | 3/2000 | Shimizu | 327/333 |
| 6,099,100 A | 8/2000 | Lee | 326/83 |
| 6,259,299 B1 | 7/2001 | Ryu | 327/333 |
| 6,373,315 B2 | 4/2002 | Tsuji et al. | 327/333 |
| 6,504,405 B1 * | 1/2003 | Nguyen et al. | 327/67 |

* cited by examiner

*Primary Examiner*—Tuan T. Lam
(74) *Attorney, Agent, or Firm*—Fish & Neave LLP; Gary J. Tuma

(57) ABSTRACT

Voltage level shifting circuits are provided in which circuit devices are placed across sourcing output transistors to improve the switching speed of the low voltage to high voltage output transition. These circuit devices permit sourcing and sinking output transistors to be sized for optimal switching speed of the high voltage to low voltage output transition.

13 Claims, 5 Drawing Sheets

US 6,888,394 B2

VOLTAGE LEVEL SHIFTING CIRCUIT WITH IMPROVED SWITCHING SPEED

BACKGROUND OF THE INVENTION

This invention relates to voltage level shifting circuits. More particularly, this invention relates to voltage level shifting circuits with improved switching speed.

Voltage level shifting circuits "shift" signaling voltages from one voltage domain to another. For example, core logic in an integrated circuit may operate at 1.6 volts while signaling between integrated circuit chips may require 3.3 volts. In order to maintain proper circuit communication, voltage level shifting circuits provide an interface between these two voltage domains, shifting 1.6 volt signals to 3.3 volt signals and vice versa.

Voltage level shifting circuits typically receive differential input signals and generate differential output signals (that is, they receive two input signals representing opposite logic states and generate two output signals representing opposite logic states). Each output switches from one logic state (or voltage level) to another logic state (or voltage level) when the input logic states (or voltages levels) switch from one to another. For example, a logical "1" may correspond to a voltage substantially equaling a supply voltage Vdd, while a logical "0" may correspond to a voltage substantially equaling ground. Upon a change in the logic state of an input (e.g., from "0 to 1" or from "1 to 0"), the logic state of an output will change after a finite period of time.

This finite period of time is the transition time required for the circuit output to switch from one logic state to another when the input logic state changes. The amount of voltage shift (e.g., from ground to Vdd) in conjunction with the transition time is the slew rate. In other words, the slew rate is the rate at which the output voltage changes, typically expressed in volts/sec. Preferably, the transition time is as short as possible and the slew rate is as high as possible. Ideally, the transition time is zero and the slew rate is infinite, resulting in an instantaneous output voltage change.

However, because the sizes of sourcing and sinking output drive transistors in known voltage level shifting circuits are often balanced to ensure comparable, if not equal, transition times for both the "0 to 1" and "1 to 0" output transitions, the resulting simultaneous charging and discharging of parasitic and load capacitances during transistor switching often results in a less than satisfactory slew rate. In other words, the sizes of the sourcing and sinking transistors, which affect transistor switching speed, cannot be simultaneously optimal for both the 1 to 0 and 0 to 1 transitions. For example, a small source transistor and a large sink transistor typically have a fast 1 to 0 transition, but a slow 0 to 1 transition. Conversely, a large source transistor and a small sink transistor have a slow 1 to 0 transition, but a fast 0 to 1 transition.

In view of the foregoing, it would be desirable to provide a voltage level shifting circuit with an improved slew rate.

SUMMARY OF THE INVENTION

It is an object of this invention to provide a voltage level shifting circuit with an improved slew rate.

In accordance with this invention, level shifting circuits are provided with additional circuit devices coupled across sourcing output transistors that permit both sourcing and sinking output transistors to be sized for improved switching speeds of both the 0 to 1 and the 1 to 0 output transitions. These additional circuit devices increase the speed of the 0 to 1 output transition without affecting the 1 to 0 output transition. This allows the sourcing transistors to be small in size and the sinking transistors to be large in size to increase the speed of the 1 to 0 transition without adversely affecting the speed of the 0 to 1 transition.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention provides voltage level shifting circuits with improved slew rates. These level shifting circuits include additional circuit devices, such as transistors and inverters, that improve the switching speed of the 0 to 1 output transition, allowing the source and sink output transistors to be sized for improved switching speed of the 1 to 0 output transition.

Figure 1:
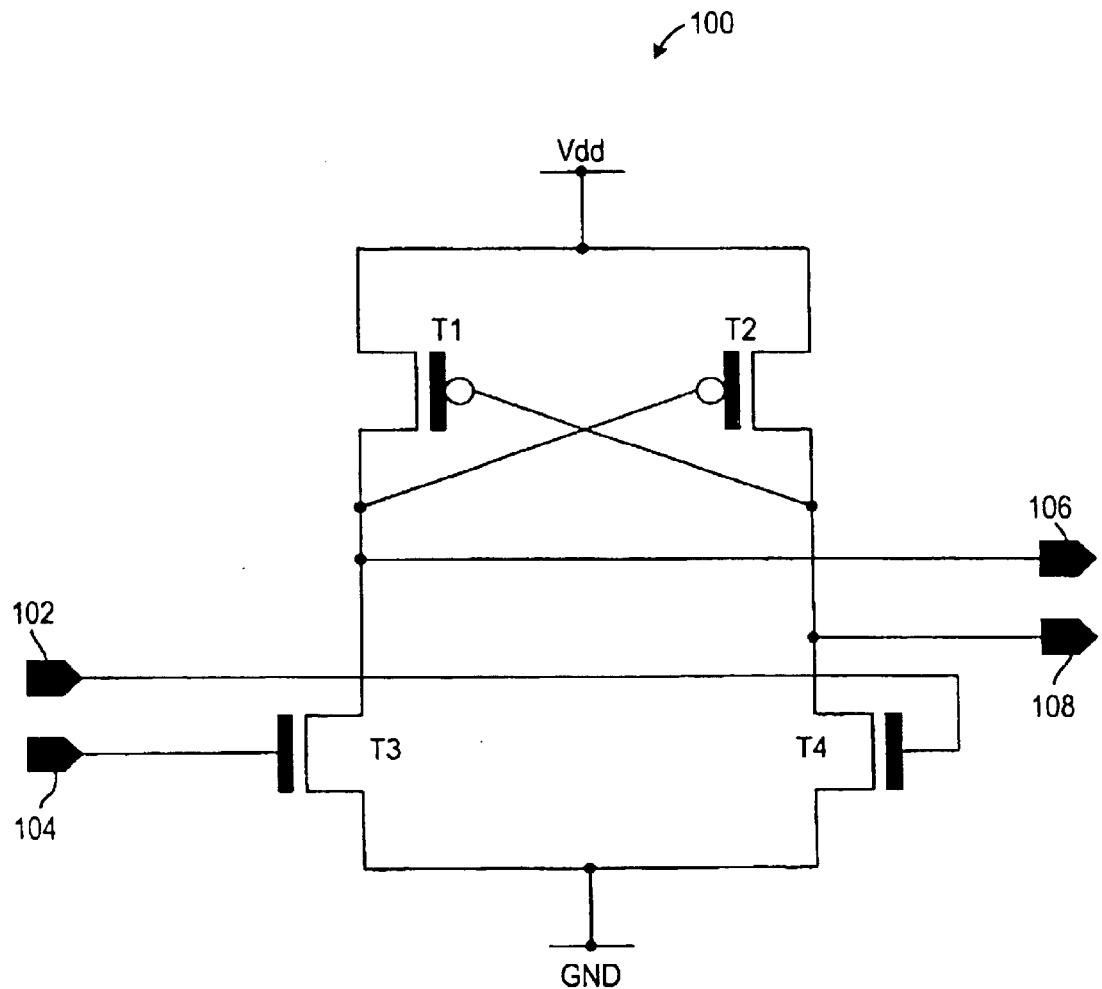
FIG. 1 is a circuit diagram of a known voltage level shifting circuit.

FIG. 1 shows a known voltage level shifting circuit 100. Circuit 100 includes p-type CMOS devices T1 and T2 and n-type CMOS devices T3 and T4. A p-type CMOS device is "ON" (i.e., it conducts current) when voltage applied to its gate is low (e.g., ground or another logical 0 value) and is "OFF" (i.e., it does not conduct current) when voltage applied to its gate is high (e.g., supply voltage (Vdd) or another logical 1 value). An n-type CMOS device is ON when voltage applied to its gate is high and is OFF when voltage applied to its gate is low. Circuit 100 also includes differential signal input nodes 102 and 104, which are inverting and non-inverting, respectively. That is, voltages at input nodes 102 and 104 are either logical 1 and logical 0, respectively, or logical 0 and logical 1, respectively. Circuit 100 further includes differential output nodes 106 and 108. The Vdd voltage is typically that of a first voltage domain (i.e., the voltage domain to which the output signals are being transmitted), while the voltage levels of the input signals at nodes 102 and 104 are that of a second voltage domain (i.e., the voltage domain from which the signals were generated).

Starting in steady state with a logical 1 at input node 102 and a logical 0 at input node 104, and output node 106 at logical 1 and output node 108 at logical 0, circuit 100 operates as follows: when the input at node 102 changes to a logical 0 and the input at node 104 changes to a logical 1, T4 turns OFF and T3 turns ON. As T3 turns ON, output node 106 is pulled down toward ground (logical 0). This causes T2 to turn ON. As T2 turns ON, output node 108 is pulled up toward Vdd (logical 1), which causes T1 to turn OFF. As T1 turns OFF, output 106 is pulled farther down toward ground. This increases the drive to T2, thus effecting a regenerative action that establishes a change of state on the outputs.

Large n-type devices and small p-type devices result in a fast 1 to 0 output transition and good drive at the p-type devices. Thus, for optimal performance of the 1 to 0 output transition at output 106, T3 should be larger than T1, because large transistors sink currents quickly and small transistors turn ON and OFF quickly. Thus, as T3 turns ON, output 106 is quickly pulled down to about ground. T2 then turns ON quickly, which pulls output 108 up, causing T1 to turn OFF. The result is a fast 1 to 0 transition at output 106. However, the sourcing ability of small p-type devices is poor, resulting in a slow 0 to 1 transition at output 108.

Moreover, small n-type devices and large p-type devices result in poor drive to the p-type devices, causing excessive delays in the establishment of the regenerative action and a resultant glitch in the output. Thus, simply having a T1 larger than T3 does not improve the 0 to 1 transition. When input node 104 changes to a logical 1, a large T1 continues to source a large current as a small T3 turns ON. This slows the turn ON of a large T2, which slows the rise of output node 108 to Vdd. A slow rising output 108 slows the turn OFF of large T1. Until T1 turns OFF, there is contention between T1 and T3. Moreover, the greater the ratio between T1 and T3 (i.e., the larger T1 is with respect to T3), the poorer the drive to T2, because the T1/T3 circuit is effectively an inverter with a current source load. Thus, a fast 0 to 1 output transition is difficult to obtain because of the contention between the p-type and n-type devices.

Note that the same contention exists between T2 and T4 when output node 106 undergoes a 0 to 1 transition, resulting in the same slow performance.

Note also that the mismatch in performance between the 1 to 0 output transition and the 0 to 1 output transition is more pronounced in cases where the Vdd voltage domain is higher than the voltage domain of the input signals received at inputs 102 and 104.

Known voltage level shifting circuits typically balance the sizes of the output transistors to achieve comparable, if not equal, switching speeds for each transition. This results in mediocre, if not unsatisfactory, slew rates. Moreover, such mediocre switching speeds increase the duration of "crowbar" current, which is current that flows from Vdd to ground when both T1 and T3 (and both T2 and T4) are ON simultaneously during an output transition. Crowbar current wastes power and reduces circuit performance by diverting source current to ground instead of to a load connected to the output of the circuit.

Figure 2:
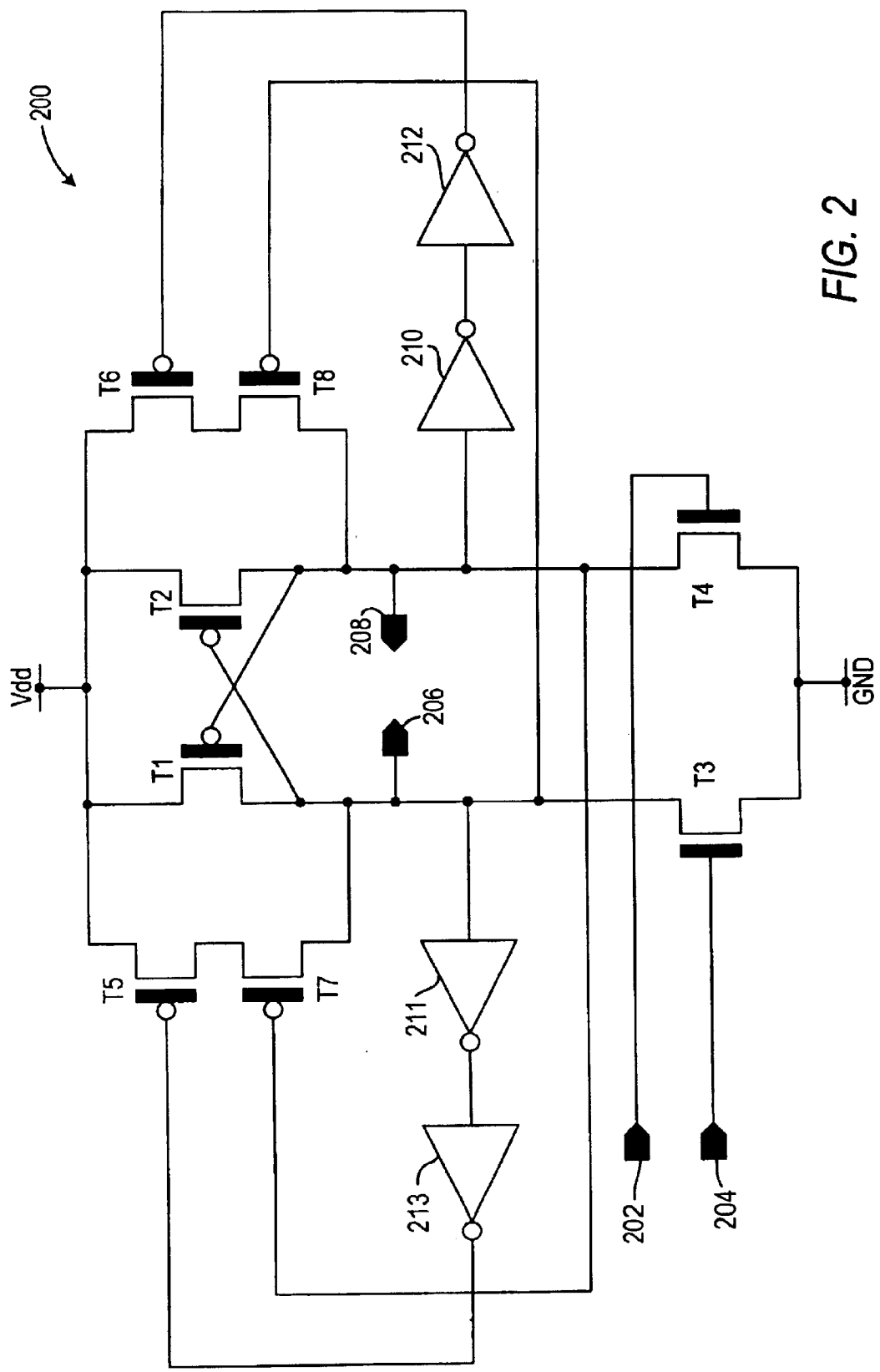
FIG. 2 is a circuit diagram of a preferred embodiment of a voltage level shifting circuit according to the invention.

FIG. 2 shows an embodiment of a voltage level shifting circuit in accordance with the invention. Circuit 200 has improved slew rates for both the 0 to 1 and 1 to 0 transitions and includes p-type CMOS devices T1 and T2 and n-type CMOS devices T3 and T4. Advantageously, circuit 200 preferably includes p-type CMOS devices T5 and T7 cascaded across T1 and p-type CMOS devices T6 and T8 cascaded across T2. The gate of T7 is connected to the gate of T1, and thus, they are driven together. Similarly, the gates of T8 and T2 are connected and driven together. The gate of T5 is driven by the voltage at output node 206 via inverters 211 and 213. The signal delay through inverters 211 and 213 is $t_{DELAY}$, which is preferably greater than the rise time (i.e., the 0 to 1 transition) of an input signal at input nodes 202 and 204. The gate of T6 is driven by the voltage at output node 208 via inverters 210 and 212, and the delay through inverters 210 and 212 is also $t_{DELAY}$. As described below, inverters 211 and 213 ensure that both T5 and T7 are ON simultaneously during a 0 to 1 output transition at output node 206, and inverters 210 and 212 ensure that both T6 and T8 are ON simultaneously during a 0 to 1 output transition at output node 208.

The relative sizes of the CMOS devices of circuit 200 are as follows: T5 is very large, T7 and T3 are large, and T1 is small. Similarly, T6 is very large, T8 and T4 are large, and T2 is small. For substantially equal switching speeds of both output transitions at outputs 206 and 208, T5 and T6 are preferably the same size, as are T7 and T8, T3 and T4, and T1 and T2. With respect to each other, T3 and T7 are preferably sized such that they provide equal drive at the output, thus ensuring symmetrical rise and fall times. The same is true for T4 and T8.

Circuit 200 preferably operates as follows: T5 (the very large device) is ON when output 206 is at a logical 0. This precharges the T5/T7 junction. When output 208 switches to logical 0, T7 and T1 turn ON. Because T5 is very large, a large current flows through it and T7, resulting in a fast 0 to 1 (or rising) transition at output 206. As output 206 switches to logical 1 and this change of state propagates through inverters 211 and 213 a finite time later (i.e., after $t_{DELAY}$), T5 turns OFF. T1 alone, which is an advantageously small device, then holds output 206 at a logical 1.

Transistors T6 and T8 and inverters 210 and 212 operate in a substantially identical manner with respect to transistors T2 and T4 and a 0 to 1 transition at output 208.

Furthermore, as discussed above, because T3 is larger than T1, and because T4 is larger than T2, circuit 200 has a fast 1 to 0 (or falling) output transition at outputs 206 and 208. Moreover, transistors T5–T8 and inverters 210–213 do not adversely affect the 1 to 0 transition.

Transistors T5–T8 and inverters 210–213 advantageously allow transistors T1 and T2 to be reduced in size. This can be done because much less drive (or sourcing) capability is required to maintain an output in a high voltage state than is required to switch to that state in the first place. The larger p-type devices placed across T1 and T2 only operate during the 0 to 1 output transition to increase the speed of that transition. They do not impair the speed of the 1 to 0 output transition. Furthermore, smaller T1 and T2 devices result in faster 1 to 0 output transitions and allow T3 and T4 to be proportionately reduced in size without adversely affecting the speed of either transition. Also, smaller T3 and T4 transistors and faster switching transitions advantageously reduce crowbar current during the periods when transistors T1, T5, T7, and T3 are conducting simultaneously and when transistors T2, T6, T8, and T4 are conducting simultaneously.

Figure 3:
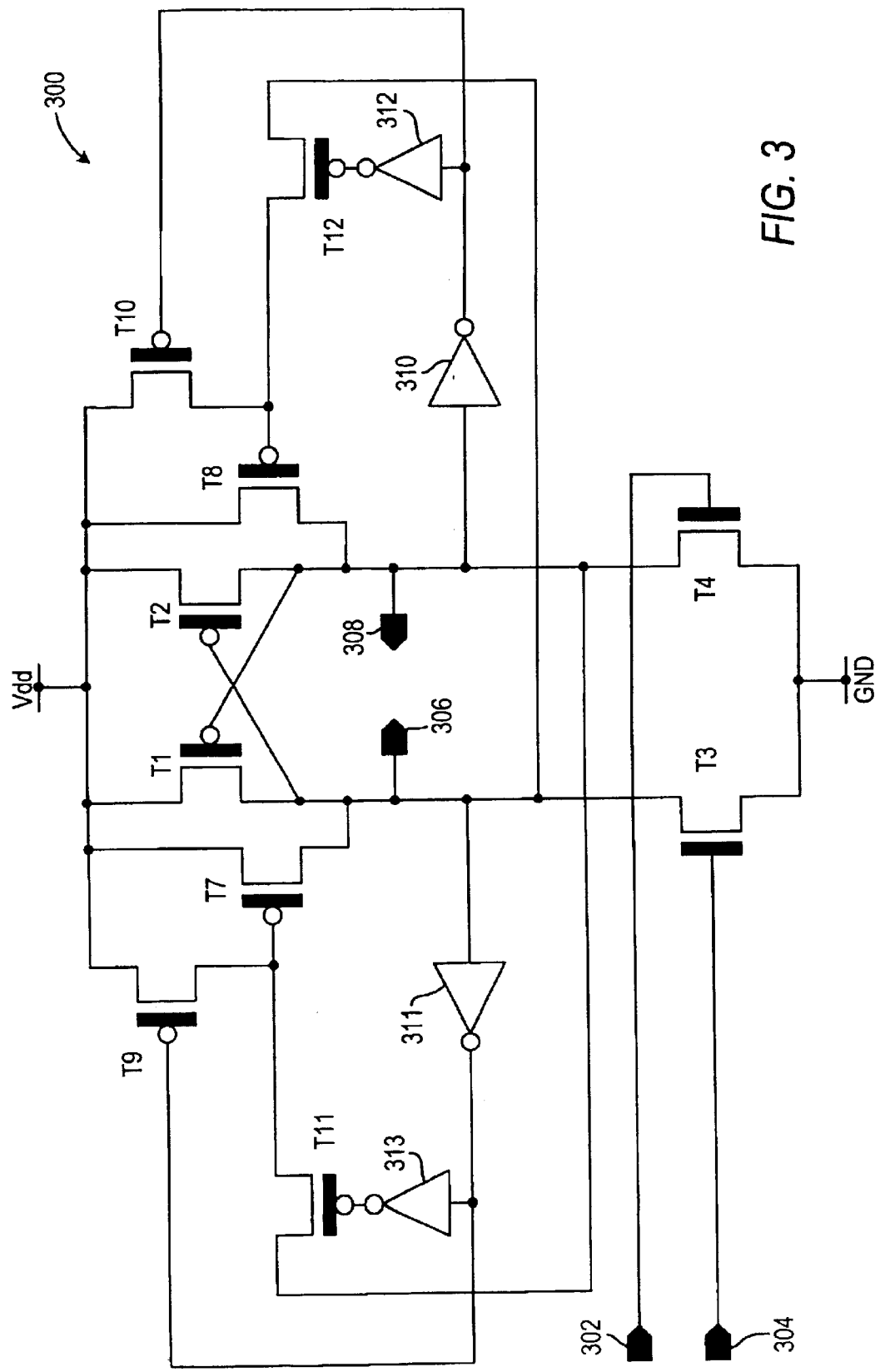
FIG. 3 is a circuit diagram of another preferred embodiment of a voltage level shifting circuit according to the invention.

FIG. 3 shows another embodiment of a voltage level shifting circuit in accordance with the invention. Circuit 300 includes p-type CMOS devices T1, T2, T7, T8, and T9–T12; n-type CMOS devices T3 and T4; and inverters 310–312. Note that T5 and T6 of circuit 200 are not included in circuit 300. This reduces the effective impedance of the circuit, leaving T7 and T8 alone to bypass T1 and T2, respectively. The gate of T7 is driven by transmission gate T11 and T9, while the gate of T8 is driven by transmission gate T12 and T10. This results in circuit 300 advantageously having faster switching speeds than circuit 200.

Circuit 300 preferably operates as follows: with output 306 in a low voltage state and output 308 in a high voltage state, T11 is ON and T9 is OFF. When the input signals at inputs 302 and 304 change state, the decreasing voltage at output 308 is passed by transmission gate T11 and T9 to the gate of T7, turning T7 ON. Because T7 is large (as in circuit 200), a comparatively large current flows from Vdd providing a fast 0 to 1 output transition at output 306. With output 306 at logical 1, T9 switches ON after the propagation delay through inverter 311, while T11 switches OFF after the propagation delay through both inverters 311 and 313. T1, which is again small, as in circuit 200, is left to maintain output 306 in the high voltage state.

The 1 to 0 transition at output 306 is also fast. Because T3 is larger in size than T1, output 306 is quickly brought down to a logical 0 voltage level when input 304 switches to a logical 1, turning T3 ON.

The operation of the right side of circuit 300 with respect to both the 0 to 1 and 1 to 0 output transitions at output 308 and the switching of transistors T2, T4, T8, T10, and T12 and inverters 310 and 312 is substantially identical to that described above for the left side of circuit 300.

Figure 4:
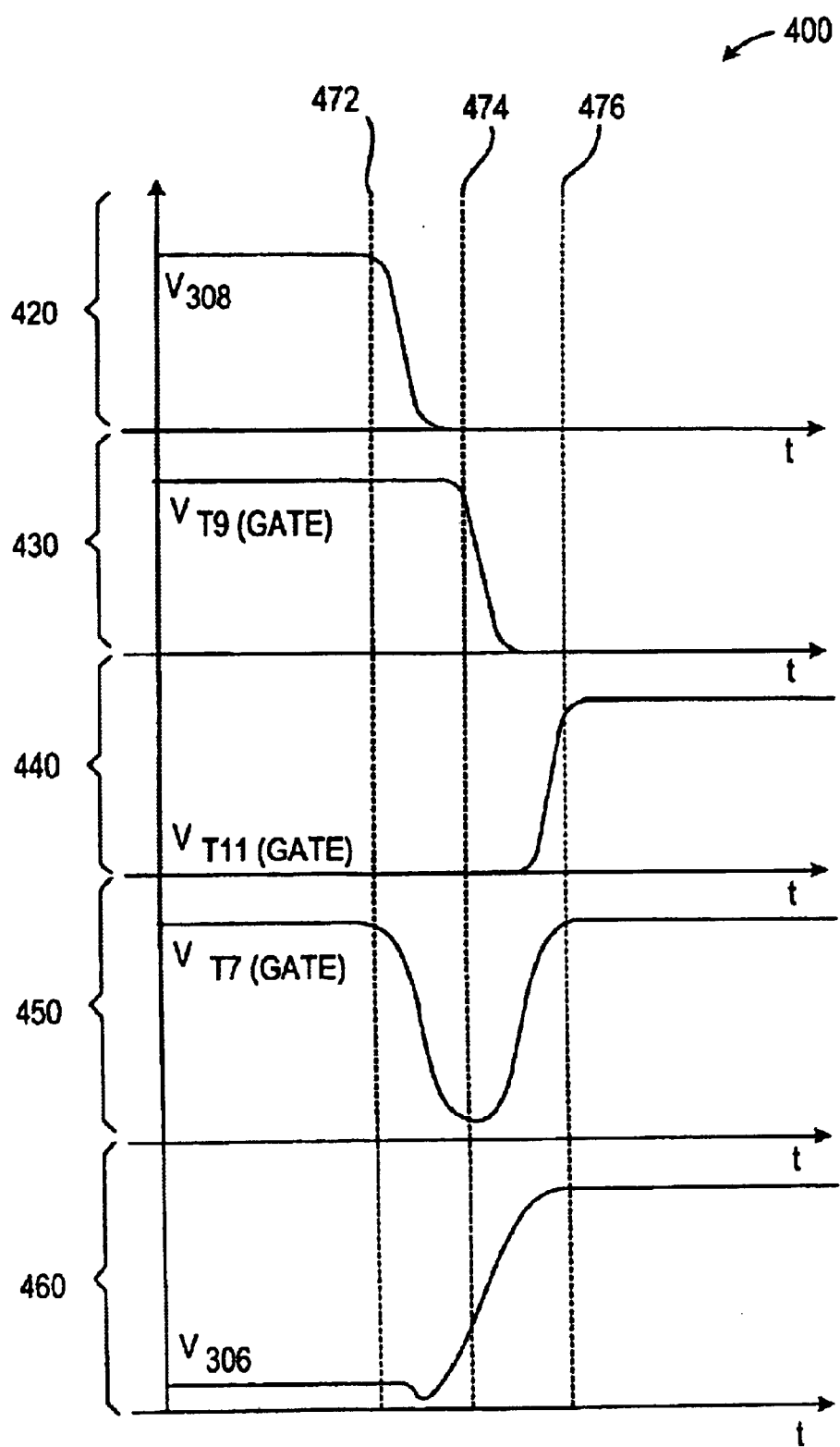
FIG. 4 is a timing diagram of various voltge waveforms of the voltage level shifting circuit of FIG. 3 according to the invention.

FIG. 4 illustrates an output switching transition of circuit 300 in accordance with the invention. Waveform 420 illustrates the 1 to 0 (falling) transition at output 308. Waveform 430 illustrates the output voltage of inverter 311 (which is also the gate voltage of T9). Waveform 440 illustrates the output voltage of inverter 313 (which is also the gate voltage of T11). Waveform 450 illustrates the net voltage controlling the gate of T7, and waveform 460 illustrates the 0 to 1 (rising) transition at output 306.

With respect to waveforms 400, circuit 300 preferably operates as follows: before time 472, output 308 is a logical 1, T9 is OFF, T11 is ON, T7 is OFF, and output 306 is a logical 0. Just before time 472, inputs 302 and 304 change state. Input 302 switches to a logical 1, turning T4 ON, which causes output 308 to quickly switch to a logical 0 by time 474 as shown. The voltage at output 308 is passed through to T7 by T11, turning T7 ON (note the tracking of voltages at output 308 and the gate of T7). As the voltage at output 308 decreases, T1 begins to turn ON, while T3 begins to turn OFF as a result of input 304 switching to a logical 0 (not shown). Output 306 begins to rise to a logical 1. As the rising voltage at output 306 propagates through inverter 311, the voltage at the gate of T9 begins decreasing at time 474, as shown in waveform 430. Shortly after time 474, the voltage at the gate of T7 begins to rise as a result of T9 turning ON. As the voltage at output 306 propagates through inverters 311 and 313, the voltage at the gate of T11 begins to rise, turning T11 OFF. After time 476, output 308 is a logical 0, output 306 is a logical 1, T9 is ON, T11 is OFF, and T7 is OFF.

Figure 5:
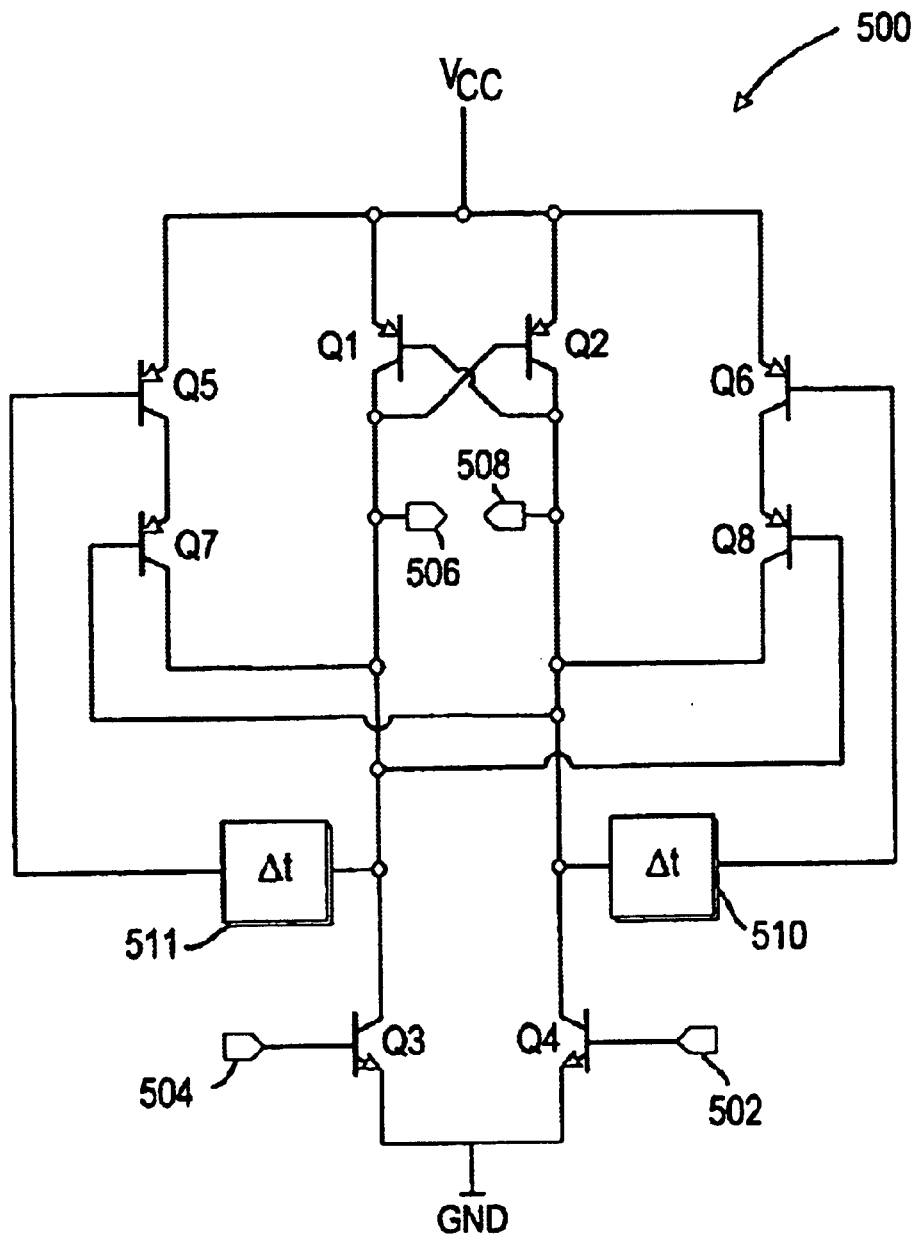
FIG. 5 is a circuit diagram of an alternative embodiment of a voltage level shifting circuit according to the invention.

Note that although circuits 200 and 300 are implemented as shown in a CMOS technology, the invention is applicable to other circuit technologies, such as, for example, a bipolar circuit technology, as shown in FIG. 5. In accordance with the invention, bipolar voltage level shifting circuit 500 preferably includes input nodes 502 and 504; PNP (or p-type) bipolar transistors Q1, Q2, and Q5–Q8; NPN (or n-type) bipolar transistors Q3 and Q4; delay elements 510 and 511; and output nodes 506 and 508.

Thus it is seen that voltage level shifting circuits are provided that have improved slew rates. One skilled in the art will appreciate that the invention can be practiced by other than the described embodiments, which are presented for purposes of illustration and not of limitation, and the invention is limited only by the claims which follow.

We claim:

1. A voltage level shifting circuit having an output, a first transistor operative to provide a high voltage at said output when conducting, and a second transistor operative to provide a low voltage at said output when conducting, said first transistor coupled to a first voltage and to said second transistor, said second transistor also coupled to a second voltage, said second voltage being lower than said first voltage, said circuit comprising:

a third transistor coupled in parallel with said first transistor, said third transistor coupled to said first voltage and to a node between said first and second transistors, said third transistor larger in size than each of said first and second transistors; wherein:

said second transistor is larger in size than said first transistor.

2. The voltage level shifting circuit of claim 1 wherein said second voltage is substantially ground.

3. The voltage level shifting circuit of claim 1 wherein:

said first transistor is a p-type transistor;

said second transistor is an n-type transistor; and said third transistor is a p-type transistor.

4. The voltage level shifting circuit of claim 1 wherein:

said first transistor is a p-type CMOS transistor;

said second transistor is an n-type CMOS transistor; and said third transistor is a p-type CMOS transistor.

5. The voltage level shifting circuit of claim 1 wherein:

said first transistor is a p-type bipolar transistor;

said second transistor is an n-type bipolar transistor; and said third transistor is a p-type bipolar transistor.

6. A voltage level shifting circuit comprising:

an input;

an output;

a first transistor operative to provide a high voltage at said output, said first transistor having three terminals, a first of said terminals coupled to a first voltage, a second of said terminals coupled to said output;

a second transistor operative to provide a low voltage at said output, said second transistor having three terminals, a first of said terminals coupled to said output, a second of said terminals coupled to a second voltage, and a third of said terminals coupled to said input; and a third transistor having three terminals, a first of said terminals coupled to said first voltage, a second of said terminals coupled to a first node, and a third of said terminals coupled to receive a delayed signal from said output; and a fourth transistor having three terminals, a first of said terminals coupled to said first node, a second of said terminals coupled to said output, and third of said terminals coupled to a third of said first transistor terminals; wherein:

said second voltage is lower than said first voltage;

said third transistor is larger in size than each of said first and second transistors; and said second transistor is larger in size than said first transistor.

7. The voltage level shifting circuit of claim 6 wherein said first, second, and third terminals of at least one of said first, second, and, third transistors are a drain, a source, and a gate of a CMOS transistor device.

8. The voltage level shifting circuit of claim 6 wherein said first, second, and third terminals of at least one of said first, second, and third transistors are an emitter, a collector, and a base of a bipolar transistor device.

9. The voltage level shifting circuit of claim 6 wherein said second voltage is substantially ground.

10. A voltage level shifting circuit comprising:

an input;

an output;

a first p-type CMOS transistor operative to provide a high voltage at said output, said first transistor having a source, a drain, and a gate, said source coupled to a first voltage, said drain coupled to said output;

an n-type CMOS transistor operative to provide a low voltage at said output, said second transistor having a source, a drain, and a gate, said drain coupled to said output, said source coupled to a second voltage, and said gate coupled to said input; and a second p-type CMOS transistor having a source, a drain, and a gate, said source coupled to said first voltage, said drain coupled to said output, and said gate coupled to said gate of said first p-type CMOS transistor; wherein:

said second voltage is lower than said first voltage;

said second p-type CMOS transistor is larger in size than each of said first p-type CMOS transistor and said n-type CMOS transistor; and said n-type CMOS transistor is larger in size than said first p-type CMOS transistor.

11. The voltage level shifting circuit of claim 10 wherein:

said first voltage is a supply voltage; and said second voltage is substantially ground.

12. A method of improving the output voltage switching speed of a circuit, said method comprising:

turning on a first transistor;

sourcing a first amount of current to an output node via said first transistor during a low voltage to high voltage output transition;

passing a voltage to a second transistor via a third transistor to turn on said second transistor;

sourcing a second amount of current to said output node via said second transistor substantially simultaneously as said first amount during said low voltage to high voltage output transition, said second amount of current greater than said first amount of current;

turning off said third transistor after a propagation delay through at least one circuit element; and maintaining a high voltage output state at said output node with only said first transistor.

13. Apparatus for improving the output voltage switching speed of a circuit, said apparatus comprising:

means for turning on a first transistor;

means for sourcing a first amount of current to an output node via said first transistor during a low voltage to high voltage output transition;

means for passing a voltage to a second transistor via a third transistor to turn on said second transistor;

means for sourcing a second amount of current to said output node via said second transistor substantially simultaneously as said first amount during said low voltage to high voltage output transition, said second amount of current greater than said first amount of current;

means for turning off said third transistor after a propagation delay through at least one circuit element; and means for maintaining a high voltage output state at said output node.

* * * * *